(12) United States Patent
George et al.

(10) Patent No.: US 11,327,105 B2
(45) Date of Patent: May 10, 2022

(54) FAULT LOCATION IN MULTI-TERMINAL TAPPED LINES

(71) Applicant: Hitachi Energy Switzerland AG, Baden (CH)

(72) Inventors: Neethu George, Bangalore (IN); Obbalareddi Demudu Naidu, Bangalore (IN); Sachin Srivastava, Bangalore (IN); A. V. Sai, Ongole (IN)

(73) Assignee: Hitachi Energy Switzerland AG, Baden (CH)

( * ) Notice: Subject to any disclaimer, the term of this patent is extended or adjusted under 35 U.S.C. 154(b) by 26 days.

(21) Appl. No.: 16/958,076

(22) PCT Filed: Jun. 14, 2018

(86) PCT No.: PCT/IB2018/054376
§ 371 (c)(1),
(2) Date: Jun. 25, 2020

(87) PCT Pub. No.: WO2019/130071
PCT Pub. Date: Jul. 4, 2019

(65) Prior Publication Data
US 2021/0063463 A1   Mar. 4, 2021

(30) Foreign Application Priority Data
Dec. 29, 2017  (IN) .............. 201741047202

(51) Int. Cl.
*G01R 31/08* (2020.01)
*H02H 1/00* (2006.01)
*H02H 7/26* (2006.01)

(52) U.S. Cl.
CPC ......... *G01R 31/085* (2013.01); *G01R 31/088* (2013.01); *H02H 1/0007* (2013.01); *H02H 7/263* (2013.01)

(58) Field of Classification Search
CPC .... G01R 31/085; G01R 31/088; G01R 31/08; H02H 1/0007; H02H 7/263
See application file for complete search history.

(56) References Cited

U.S. PATENT DOCUMENTS

| 6,256,592 B1 | 7/2001 | Roberts et al. |
| 7,286,963 B2 | 10/2007 | Saha et al. |

(Continued)

FOREIGN PATENT DOCUMENTS

| CN | 101672883 A | 3/2010 |
| CN | 101779134 A | 7/2010 |

(Continued)

OTHER PUBLICATIONS

Girgis, Adly A., et al., "A New Fault Location Technique for Two- and Three-Terminal Lines", IEEE Transactions on Power Delivery, vol. 7, No. 1, Jan. 1992, pp. 98-107.

*Primary Examiner* — Farhana A Hoque
(74) *Attorney, Agent, or Firm* — Slater Matsil, LLP (57) ABSTRACT

A device can be used with a power transmission system that includes three section that are connected at a junction, each section being from a corresponding. An input interface receives measurements of voltages and currents carried out at one or more of the first terminal, the second terminal and the third terminal or positive sequence voltage and current phasors obtained from the measurements of voltages and currents carried out at one or more of the first terminal, the second terminal and the third terminal. A phasor calculation module calculates positive sequence voltage and current phasors from the measurements of voltages and currents carried out at a terminal of the power transmission system. A fault locator obtains the fault location based on the section with the fault, the positive sequence voltage and current (Continued)

phasors obtained for each terminal, and the positive sequence line impedance parameters of each section.

21 Claims, 3 Drawing Sheets

(56) References Cited

U.S. PATENT DOCUMENTS

| | | |
|---|---|---|
| 7,472,026 B2 | 12/2008 | Premerlani et al. |
| 9,236,726 B2 * | 1/2016 | Safari-Shad .......... A61B 1/125 |
| 2011/0037480 A1 | 2/2011 | Balcerek et al. |
| 2012/0068717 A1 | 3/2012 | Gong et al. |

FOREIGN PATENT DOCUMENTS

| | | | |
|---|---|---|---|
| CN | 102081132 A | | 6/2011 |
| CN | 104330703 A | | 2/2015 |
| CN | 107064736 A | | 8/2017 |
| WO | 2017072612 A1 | | 5/2017 |
| WO | WO2017072612 | * | 5/2017 |

* cited by examiner

FAULT LOCATION IN MULTI-TERMINAL TAPPED LINES

CROSS-REFERENCE TO RELATED APPLICATIONS

This application is a national phase application of International Application No. PCT/IB2018/054376, filed on Jun. 14, 2018, which application claims priority to Indian Patent Application No. 201741047202, filed Dec. 29, 2017, which applications are hereby incorporated herein by reference.

FIELD OF THE INVENTION

The present invention generally relates to fault location in power transmission systems. More specifically, the present invention relates to fault location in multi-terminal tapped lines.

BACKGROUND OF THE INVENTION

In order to evacuate the renewable power or supply power to bulk industrial loads, multi-terminal or tapped lines provides an attractive solution to provide power at minimum cost. Using multi-terminal/tapped lines saves the costs associated with building substation and installing measurement transformers at tap/junction point. There has been a huge growth in the number of multi-terminal/tapped lines mainly due to increased renewable integration to the grid. This is true in cases of solar parks and wind farms where the power evacuation to the main grid is done through short lines. Introducing tap in the main line complicates the protection and fault location.

Fast restoration of outages is very important to utilities for maintaining the thermal loading of the transmission lines and stability of the power system. Thus, accurate fault location in multi-terminal lines is very important for maintenance crew to reach the fault point and undertake repair quickly. Quick identification of fault location improves the reliability, availability and assists in reducing revenue losses.

There are numerous techniques available for the transmission lines, but accurate fault location for multi-terminal lines (different configurations) and multi-terminal mixed lines still remains a challenge as each section have different X/R ratio.

A fault location method for multi-terminal lines using only selected negative sequence quantities at all terminals is known. Though the communication requirement between relays is reduced in this method, the solution does not work for all fault cases. Balanced faults do not produce any negative-sequence signals rendering this method not suitable for these fault cases. The method also requires the knowledge of source impedance magnitude and angle at all terminals, which might not always be available. This method does not consider capacitive current compensation and it may introduce more error in case of fault in cable section.

A fault location method for multi-terminal lines using voltage and current quantities at all terminal is also known. In this method, a solution for two-terminal lines is formulated. Further, for the multi-terminal line, the faulted section is identified; and the fault location is calculated by considering the faulted section as a two-terminal line, and using the solution formulated for two-terminal lines.

In the existing solutions, the calculation of junction current on a faulted line is performed using current distribution factors. These current distribution factors are dependent on various factors like source impedances, and may not compensate for line capacitance effects, which can introduce considerable error. The calculation of junction current from the currents measured at the terminal for the faulted line is challenging. This is because the fault resistance and the currents through the fault resistance, both of which are unknown, has to be accounted for during this calculation.

There is accordingly a need for alternate means for obtaining the fault location in case of multi-terminal tapped lines.

SUMMARY OF THE INVENTION

Various aspects of the invention relate to a device and method for fault location in a power transmission system. The power transmission system can be a multi-terminal tapped line. For instance, the power transmission system can be three-terminal system, with three line sections (e.g. overhead line sections) that are connected at a junction or a tap.

In accordance with various embodiments, the power transmission system connects three or more terminals. Accordingly, the system has at least a first terminal, a second terminal and a third terminal. In such a scenario, the power transmission system comprises three or more sections, with at least a first section, a second section and a third section. Here, the first, second and third sections are connected at a junction(s), wherein the first section is from the first terminal to the junction, the second section is from the second terminal to the junction, and the third section is from the third terminal to the junction.

There may be an electrical fault (or disturbance) at a particular location in the power transmission system. Faults can happen in an overhead line, or at a junction between overhead lines. The fault may be located at the junction or, in a particular section of the power transmission system. For example, the fault can be located in one of the first section, the second section and the third section.

The device of the present invention, locates the fault in the power transmission system. The device can be an Intelligent Electronic Device (IED). This may be an IED associated with one of a line section, a junction, a terminal etc. The IED receives one or more signals from one or more measurement equipment connected to the line. For example, the measurement equipment can include a current transformer, a potential transformer, a sensor-based measurement equipment (e.g. Rogowski coils, non-conventional instrument transformers etc.) and/or the like, which provides a signal corresponding to current, voltage or other information as sensed from the line. For example, a current transformer provides single/multiple phase current signal and a potential transformer can provide single/multiple phase voltage signal to the IED. In an embodiment, the device is associated with one of the first terminal, the second terminal and the third terminal, and receives data from other devices (that are associated with the other terminals).

The device has one or more modules for performing the fault location and other functions of the device. Such modules may be implemented with a processor(s) of the corresponding device. In one embodiment, the device has an input interface, a phasor calculation module, a storage and a fault locator. The input interface receives one or more of measurements of voltages and currents carried out at one or more of the first terminal, the second terminal and the third terminal; and positive sequence voltage and current phasors obtained from the measurements of voltages and currents carried out at one or more of the first terminal, the second terminal and the third terminal. In the embodiment wherein the device is an IED associated with a terminal, the IED receives a signal(s) from the corresponding measurement equipment, and obtain measurements therefrom. Alternately, the measurement equipment publishes the measurements over a bus (e.g. process bus), and the IED (e.g. subscribed to receive data from such bus) receives the measurements over the bus. Here, the IED can receive voltage/current measurements from other IEDs (associated with other terminals), or phasors obtained by the corresponding IEDs. Here, the measurements are synchronized at the three terminals.

The phasor calculation module of the device is for calculating positive sequence voltage and current phasors from the measurements of voltages and currents carried out at a terminal of the power transmission system. For instance, the IED can calculate positive sequence voltage and current phasors (e.g. using suitable phasor calculation such as Fourier calculations etc.), from the voltage/current measurements carried out at the associated terminal. The storage of the device has positive sequence line impedance parameters of each section of the power transmission system. Such parameter information can be stored in the device beforehand (e.g. by operating personnel).

The device can optionally have a fault section identification module for determining the section having the fault. In an embodiment, the section with the fault is determined by calculating a value for a voltage phasor for each terminal, and comparing that calculated value with the voltage phasor value (i.e. obtained from the voltage measurements carried at the terminal). Here, the voltage phasor is calculated for each terminal of the power transmission system. The calculation of the voltage phasor for a terminal is performed using the current phasor of the corresponding terminal, and at least the voltage and current phasors obtained for at least one other terminal of the power transmission system.

In an embodiment, determining the section with the fault comprises comparing the difference between the calculated and obtained voltage phasors for each terminal. Consider a case where the difference for each terminal is less than a threshold. In such a case, the fault may be determined to be at the junction. In an embodiment, the terminal for which the difference between the calculated and obtained voltage phasors is the lowest among all, can be identified as healthy or non-faulty sections, and conclude that other section as fault. For example, if the terminal A voltage calculated from terminal B is almost equal to the measured voltage at terminal A (difference is lowest), the fault can be identified on section CJ (that is between terminal C and junction). In another embodiment, the section associated with the terminal for which the difference between the calculated and obtained voltage phasors is the highest among all, can be identified as the section with the fault.

The fault locator obtains the fault location based on the section with the fault, the positive sequence voltage and current phasors obtained for each terminal, and the positive sequence line impedance parameters of each section. In an embodiment, the fault locator obtains the fault location by calculating an inverse hyperbolic tangent of K1/K2. Here, K1 and K2 are calculated from one or more of the positive sequence voltage and current phasors of each terminal, and the positive sequence line impedance parameters of each section.

Consider a case, wherein the fault is in the first section (or AJ). In such a case, the fault location can be derived from:

$$d_A = \frac{1}{\gamma_{AJ}^1} \tanh^{-1}\left(\frac{K1}{K2}\right)$$

Here, $\gamma_{AJ}^1$ is the propagation constant of section AJ, and K1 and K2 can be calculated from positive sequence voltage and current phasors and positive sequence line impedance parameters of each terminal (A, B, and C and corresponding sections AJ, BJ and CJ) using:

$K1 = (V_A^1 - V_B^1 A_{AJ}^1 A_{BJ}^1 - I_B^1 A_{AJ}^1 B_{BJ}^1 + B_{AJ}^1 C_{BJ}^1 V_B^1 + B_{AJ}^1 D_{BJ}^1 I_B^1 + B_{AJ}^1 C_{CJ}^1 V_C^1 + B_{AJ}^1 D_{CJ}^1 I_C^1)$ $K2 = (Z_{CAJ}^1 * (I_A^1 - C_{AJ}^1 A_{BJ}^1 V_B^1 - C_{AJ}^1 B_{BJ}^1 I_B^1 - A_{AJ}^1 C_{BJ}^1 V_B^1 - A_{AJ}^1 D_{BJ}^1 I_B^1 - A_{AJ}^1 C_{CJ}^1 V_C^1 - A_{AJ}^1 D_{CJ}^1 I_C^1)$

The inverse hyperbolic tangent may be calculated by making certain assumptions or taking only a limited number of terms in the expansion series for the hyperbolic.

The parameters K1 and K2 are obtained by equating the current flowing at the junction end in the first, second and third sections. More specifically, the fault location is obtained by equating the sum of the three currents at the junction to zero.

In the sections other than the section with the fault, the current flowing into the junction is calculated with at least the positive sequence voltage and current phasors obtained from measurements carried out at the corresponding terminals, and the positive sequence line impedance parameters of the corresponding sections.

For the section with the fault, the current at the junction end is calculated as a function of the fault location (or fault distance). The current is calculated with at least the positive sequence voltage and current phasors obtained from measurements carried out at the corresponding terminal, and the positive sequence line impedance parameters of the corresponding section.

For calculating the current at the junction end, first the voltage at the fault location is calculated. This is calculated from a two port network between the corresponding terminal and the fault location. Using the voltage at the fault location, the current at the junction end is calculated from a two port network between the fault location and the junction.

BRIEF DESCRIPTION OF DRAWINGS

The subject matter of the invention will be explained in more detail in the following text with reference to exemplary embodiments which are illustrated in attached drawings in which.

DETAILED DESCRIPTION

Various aspects of the present invention relate to fault location in a power transmission system. The power transmission system comprises a multi-terminal tapped line (multi-terminal line), which has three or more terminals.

Figure 1:
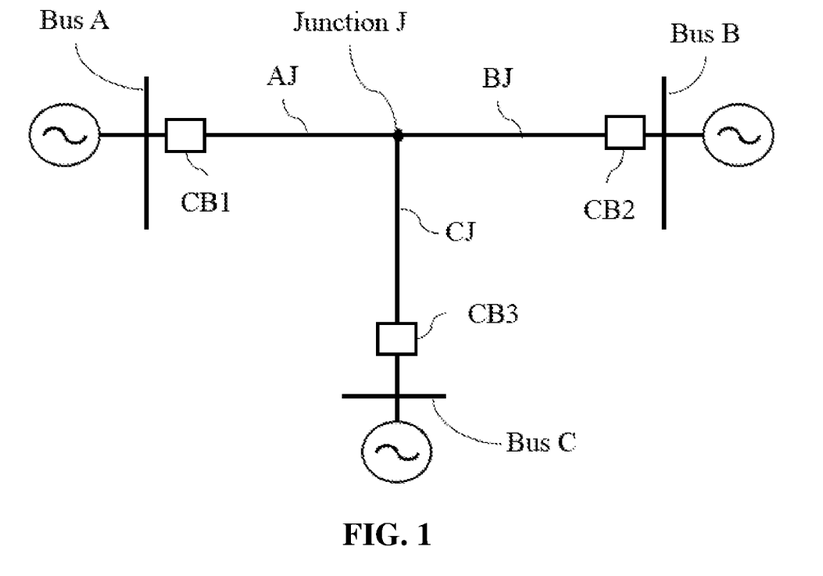
FIG. 1 is a simplified representation of a power transmission system, in accordance with an embodiment of the invention.

Referring to FIG. 1, which illustrates a multi-terminal tapped line (also referred as tapped line) connecting three terminals in accordance with an embodiment of the invention. The transmission system shown in FIG. 1 is a three terminal system. Bus A (first terminal), Bus B (second terminal) and Bus C (third terminal) are the three terminals and J is the junction. There could also be more than one junction (e.g. two or more) in case of multiple line sections between the terminals (not shown in FIG. 1). There are three sections in the system shown in FIG. 1. The first section (AJ) is from bus A and the junction, the second section is from bus B to the junction, and the third section is from bus C to the junction.

Figure 2:
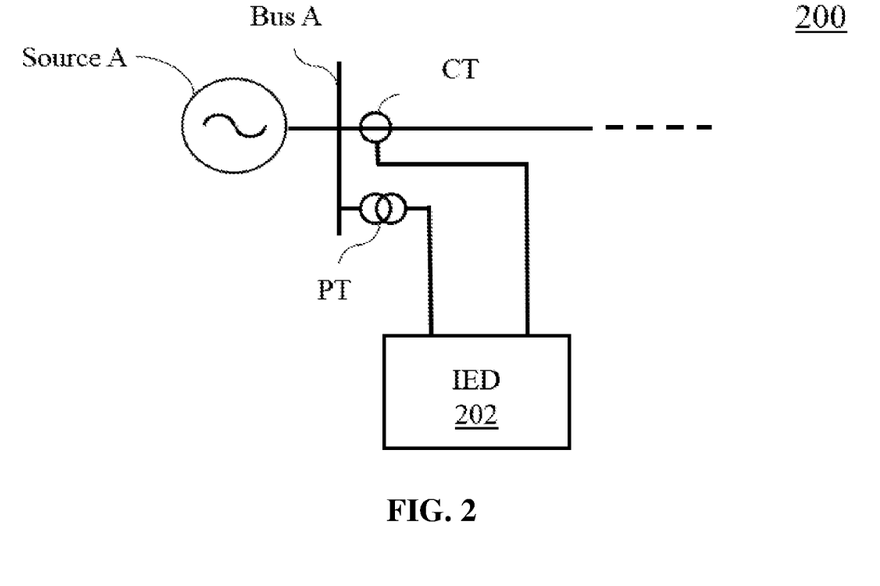
FIG. 2 is a simplified representation of a connection of an intelligent electronic device for obtaining measurements from a line, in accordance with an embodiment of the invention.

The invention provides a device and method for fault location in such a power transmission system. The fault location is performed in response to a fault in the system. The method is performed with one or more processors associated with the device. For example, the method can be implemented by an Intelligent Electronic Device (IED) with a processor. This may be an IED associated with one of a line section, a junction, a terminal etc. An example is illustrated in FIG. 2, wherein the IED (202) is associated with Bus A. The IED receives one or more signals from one or more measurement equipment connected to the line. In the example of FIG. 2, a current transformer (CT) provides single/multiple phase current signal and a potential transformer (PT) provides single/multiple phase voltage signal to the IED.

In an embodiment, the IED receives a signal(s) from the measurement equipment, and obtain measurements therefrom. In another embodiment, the measurement equipment publishes the measurements over a bus (e.g. process bus), and the IED (e.g. subscribed to receive data from such bus) receives the measurements over the bus.

The IED also communicates with IEDs associated with other buses (i.e. Bus B, C). Here, the IED at bus A may receive measurements, or phasors obtained at other IEDs. Similarly, the IED at bus B would receive information from IED at buses A and/or C, and IED at bus C would receive information from IED at buses A and/or B.

Figure 3:
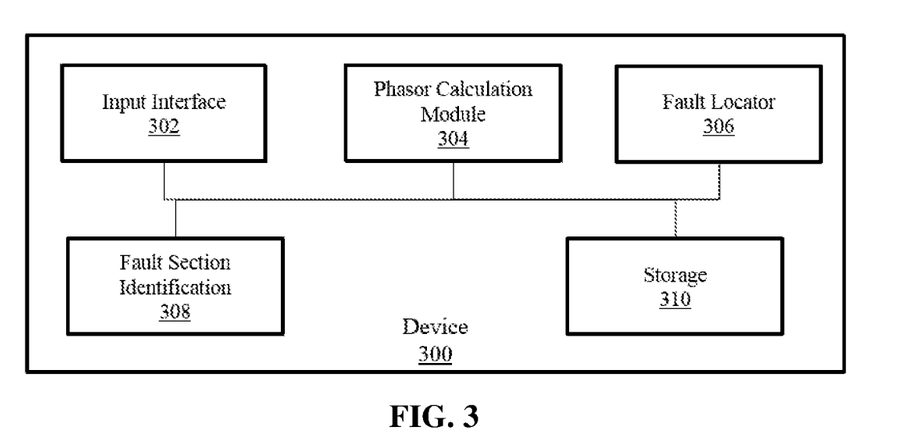
FIG. 3 is a simplified block diagram of a device for fault location, in accordance with an embodiment of the invention.

In an embodiment, the device has a plurality of modules. FIG. 3 is a simplified block diagram of the device. In accordance with the embodiment illustrated in FIG. 3, the plurality of modules include an input interface (302), a phasor calculation module (304), a fault locator (306), a fault section identification module (308) and a memory (310). The plurality of modules may be implemented using one or more processors. For instance, the one or more processors may be a processor of an IED (e.g. IED 202).

The method may also be implemented with communication between a device associated with the line, and a server. Here, some of the modules may be implemented with one or more processors of the server (e.g. calculations or use of models using measurements from various measurement equipment at various terminals of the line), while the others are performed with one or more processors of the device (e.g. input interface, fault locator etc.). Alternately, the method may be implemented at the server, and the fault location communicated to the IED or other power system device.

The input interface receives one or more of measurements of voltages and currents. Consider that the device is the IED at bus A. In this case, the IED receives the measurements obtained from the measurement equipment at Bus A. Alternately, the input interface can receive a signal(s) from the measurement equipment and obtain measurements therefrom. The input interface also acts as a communication interface for receiving information from other devices. For instance, the measurements may be published over the bus, and the IED subscribes to the same. Taking another example, the IED at bus A can receive information from IED at buses B and C, or other modules (e.g. a phasor calculation module) of other devices (e.g. on the server or other power system devices).

The phasor calculation module calculates positive sequence voltage and current phasors from the measurements of voltages and currents. The phasor calculation module can calculate different phasors from measured data. For example, the phasor calculation module can calculate positive sequence voltage and current phasors from measurements at one terminal (or bus). Such phasors may be obtained using a suitable phasor calculation such as, but not limited to, Fourier calculations. For example, from the calculated voltage phasors, positive sequence quantities are computed using following transformation matrix:

$$\begin{bmatrix} V_{a0} \\ V_{a1} \\ V_{a2} \end{bmatrix} = \frac{1}{3} \begin{bmatrix} 1 & 1 & 1 \\ 1 & a & a^2 \\ 1 & a^2 & a \end{bmatrix} \begin{bmatrix} V_a \\ V_b \\ V_c \end{bmatrix} \text{ where,}$$

$$a = e^{j120°} = -\frac{1}{2} + j\frac{\sqrt{3}}{2}.$$

The calculation of the voltage phasor for a terminal may also be performed for fault section identification, using voltage and current phasors obtained for another terminal, and the current phasor obtained for the same terminal. This is another/second voltage phasor (different from the first phasor that can be calculated from the voltage phasor from the measurement at the same terminal). For example, in case of the three terminal system with, the voltage phasor for the first terminal can be calculated using the voltage and current phasors obtained for the second terminal, and the current phasor obtained the first terminal. Here, in place of using the voltage and current phasors obtained for the second terminal, voltage and current phasors obtained for the third terminal may be used. Alternately, two voltage phasors can be calculated using the second and third terminal measurements along with the first terminal measurements, and one of the two selected.

The storage (of the device or on server) can be any suitable storage for storing different information such as, but not limited to, disturbance records, line parameters etc. Positive sequence line impedance parameters of each section of the power transmission system, is available in the storage. Such parameter information can be stored in the device beforehand (e.g. by operating personnel). This may also be stored in the server or other device, and communicated to the IED for fault location purposes.

The fault locator obtains the fault location based on the section with the fault, the positive sequence voltage and current phasors obtained for each terminal, and the positive sequence line impedance parameters of each section. The fault section identification may optionally be performed with the fault section identification module.

In an embodiment, the section with the fault is determined by calculating a value for a voltage phasor (second phasor mentioned above) for each terminal, and comparing that calculated value with the voltage phasor value (i.e. first phasor obtained from the voltage measurements carried at the terminal). Here, the voltage phasor is calculated for each terminal of the power transmission system. The calculation of the voltage phasor for a terminal is performed using the current phasor of the corresponding terminal and at least the voltage and current phasors obtained for at least one other terminal of the power transmission system.

The fault section information is used for fault location calculations. In an embodiment, the fault locator obtains the fault location by calculating an inverse hyperbolic tangent of K1/K2. Here, K1 and K2 are calculated from one or more of the positive sequence voltage and current phasors of each terminal, and the positive sequence line impedance parameters of each section.

The following describes the method of the invention, various steps of which are implemented using the device (or modules) described hereinabove.

The three-terminal system as shown in FIG. 1 is used for describing the fault location solution explained below. As shown, terminals A, B and C are the first, second and third terminals; sections AJ, BJ and CJ are the first, second and third sections and J is the junction common to all three sections. The respective line lengths of the sections AJ, BJ and CJ are denoted by $L_a$, $L_b$ and $L_c$ (not shown in FIG. 1).

Figure 4:
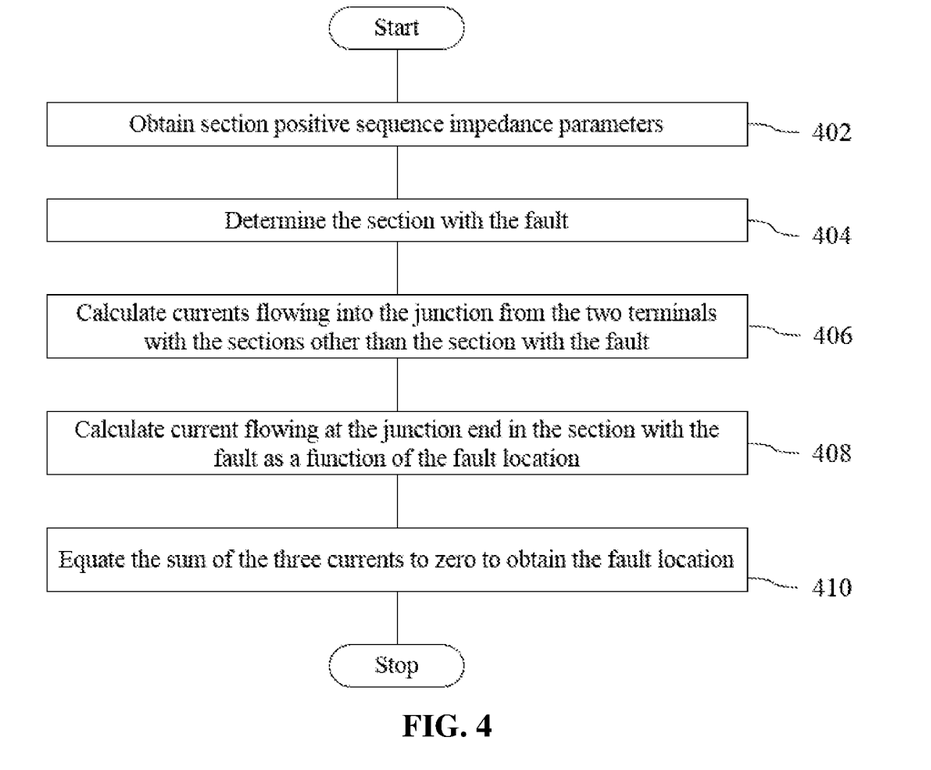
FIG. 4 is a flowchart of a method for fault location, in accordance with an embodiment of the invention.

Positive sequence line impedance parameters of the three sections AJ, BJ and CJ are represented using ABCD parameters. Here, $A_{AJ}^1$, $B_{AJ}^1$, $C_{AJ}^1$ and $D_{AJ}^1$ are respectively A, B, C and D parameters of section AJ. Similarly, $A_{BJ}^1$, $B_{BJ}^1$, $C_{BJ}^1$ and $D_{BJ}^1$ are respectively A, B, C and D parameters of section BJ, and, $A_{CJ}^1$, $B_{CJ}^1$, $C_{CJ}^1$ and $D_{CJ}^1$ are respectively A, B, C and D parameters of section CJ. The line parameters may be obtained and stored beforehand, at 402.

Voltage and current measurements are available from the disturbance recorders (IEDs) at all the three terminals. Voltage and current measurements are recorded at terminal A and post fault positive sequence voltage and current phasors are calculated from these measurements. These are denoted by $V_A^1$ and $I_A^1$ respectively (i.e. phasors obtained from measurements at terminal A). Pre-fault positive sequence voltage and current phasors may also be calculated and are denoted by $V_{Apre}^1$ and $I_{Apre}^1$ respectively. Similarly, post-fault positive sequence voltage and current phasors calculated from measurements at terminal B and C are denoted by $V_B^1$, $I_B^1$ and $V_c^1$, $I_c^1$ respectively. Pre-fault positive sequence voltage and current phasors may be calculated from measurements at terminal B and C, and are denoted by $V_{Bpre}^1$, $I_{Bpf}^1$ and $V_{cpre}^1$, $I_{cpre}^1$ respectively. The phasors can be calculated using the phasor calculation module.

At 404, the section with the fault may be determined. In order to obtain the fault location, it is required to determine which section has the fault. Such determination may be performed using the steps described below, or using other fault section identification methods. These steps are performed with the fault section identification module. It is assumed that the measurements at the three terminals are synchronized.

Step I in Fault Section Identification: Calculate the Voltages at all Three Terminals Using Measurements from the Other Terminals:

The post-fault positive sequence voltage at terminal C is calculated using voltage and current measured at terminal B, and current measured at terminal C, using equation (1)

$$V_{C\_calculated}^1 = \frac{D_{BJ}^1 * V_B^1 - B_{BJ}^1 * I_B^1 + B_{CJ}^1 * I_C^1}{D_{CJ}^1} \quad (1)$$

Similarly, the post-fault voltage at terminal A is calculated using voltage and current measured at terminal C, and current measured at terminal A, using equation (2)

$$V_{A\_calculated}^1 = \frac{D_{CJ}^1 * V_C^1 - B_{CJ}^1 * I_C^1 + B_{AJ}^1 * I_A^1}{D_{AJ}^1} \quad (2)$$

In a similar manner, the post-fault voltage at terminal B is calculated using voltage and current measured at terminal A, and current measured at terminal B, using equation (3)

$$V_{B\_calculated}^1 = \frac{D_{AJ}^1 * V_A^1 - B_{AJ}^1 * I_A^1 + B_{BJ}^1 * I_B^1}{D_{BJ}^1} \quad (3)$$

For calculating post-fault voltage of terminal C, measurements at terminal A may be used in place of measurements of terminal B. Alternately, two phasors can be calculated for comparison purposes (described below). Similar calculations can be performed for other terminals.

Step II in Fault Section Identification: Compare the Calculated Voltage at Each Terminal to the Measured Voltage at the Respective Terminals:

The comparison between the measured and calculated voltages for each terminal can be done using equations (4), (5) and (6):

$$[\Delta V_{B2A}] = |V_{B\_calculated}^1 - V_B^1| \quad (4)$$

$$[\Delta V_{C2B}] = |V_{C\_calculated}^1 - V_C^1| \quad (5)$$

$$[\Delta V_{A2C}] = |V_{A\_calculated}^1 - V_A^1| \quad (6)$$

Step III: Identification of Faulted Section:

Case I: Fault at the Junction

If the fault is at the junction, ideally, the calculated voltages at all three terminals should be equal to the respective measured voltages. That is, $\Delta V_{B2A}$, $\Delta V_{A2C}$ and $\Delta V_{C2B}$ should be ideally equal to zero. Hence, if $\Delta V_{B2A}$, $\Delta V_{A2C}$ and $\Delta V_{C2B}$ are less than a small threshold value, c, the fault is identified to be at the junction.

Case II: Fault in Section AJ

If the fault is in section AJ, $V_{C\_calculated}^1$ calculated from Bus B measurements will be ideally equal to the measured value, $V_C^1$. That is, $\Delta V_{C2B}$ will be ideally zero.

Case III: Fault in Section BJ

Similarly, if fault is in section BJ, $V_{A\_calculated}^1$ calculated from Bus C measurements will be ideally equal to the measured value, $V_C^1$. That is, $\Delta V_{A2C}$ will be ideally zero.

Case IV: Fault in Section CJ

Similarly, if fault is in section CJ, $V_{B\_calculated}^1$ calculated from Bus A measurements will be ideally equal to the measured value, $V_B^1$. That is, $\Delta V_{B2A}$ will be ideally zero.

Based on the above, we can conclude the following conditions:

If $\Delta V_{B2A}$, $\Delta V_{A2C}$ and $\Delta V_{C2B}$<ϵ→Fault at junction

If $\Delta V_{C2B}$ is minimum, section AJ has the fault→Fault in section AJ

If $\Delta V_{A2C}$ is minimum, section BJ has the fault→Fault in section BJ

If $\Delta V_{B2A}$ is minimum, section CJ has the fault→Fault in section CJ

After faulted section is identified, the fault location can be calculated using the appropriate one among the following sub-routines.

Case I: Fault is at the Junction
If fault is at junction,
IED A will display length of the section AJ as fault location
IED B will display length of the section BJ as fault location
IED C will display length of the section CJ as fault location Case II: Fault in Section AJ
For fault in section AJ, the unknown fault location from terminal A is denoted by $d_A$. For calculating the fault location, the current flowing into the junction from the terminals corresponding to the healthy sections (406), and at the junction end in the section with the fault (408) needs to be calculated.

Calculate the current flowing into the junction from one of the two terminals corresponding to one of the two healthy sections: Let us take terminal B here. From the two port network between terminal B and the junction J, the current flowing into the junction, $I_{fB}$, is calculated as, $$I_{fB} = C_{BJ}^1 V_B^1 + D_{BJ}^1 I_B^1 \tag{7}$$

Where,
$C_{BJ}^1$, $D_{BJ}^1$—positive sequence ABCD parameters of section BJ $$C_{BJ}^1 = -\cosh(\gamma_{BJ} L_B);\; D_{BJ}^1 = \frac{1}{Z_{CBJ}^1}\sinh(\gamma_{BJ} L_B)$$

$Z_{CBJ}^1$—characteristic impedance of section BJ
$\gamma_{BJ}^1$—propagation constant of section BJ
$I_{fB}$—current flowing into the junction from terminal B Here, the positive sequence ABCB parameters comprises parameters associated with charging currents (i.e. $\gamma_{BJ}^1$ propagation constant).

Calculate the current flowing into the junction from second of the two terminals corresponding to second of the two healthy sections: Let us take terminal C here. From the two port network between terminal C and the junction J, the current flowing into the junction, $I_{fC}$, is calculated as, $$I_{fC} = C_{CJ}^1 V_C^1 + D_{CJ}^1 I_C^1 \tag{8}$$

Where,
$C_{CJ}^1$, $D_{CJ}^1$—positive sequence ABCD parameters of section CJ $$C_{CJ}^1 = -\cosh(\gamma_{CJ} L_C);\; D_{CJ}^1 = \frac{1}{Z_{CCJ}^1}\sinh(\gamma_{CJ} L_C)$$

Figure 5:
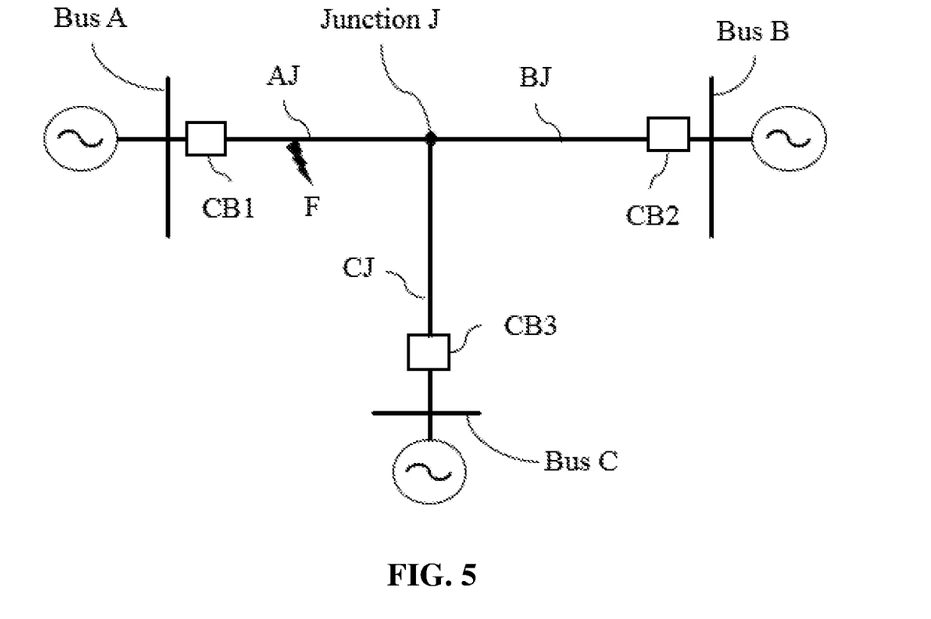
FIG. 5 is a simplified representation of a fault on section AJ of the power transmission system, in accordance with an embodiment of the invention.

$Z_{CCJ}^1$—characteristic impedance of section CJ
$\gamma_{CJ}^1$—propagation constant of section CJ
$I_{fC}$—current flowing into the junction from terminal C With the knowledge that fault is on section AJ, calculate the current flowing at the junction end on section AJ, namely, $I_{fA}$. From the two port network between terminal A and the fault point F (see FIG. 5), calculate the voltage at receiving end F using voltage and current at terminal A. This will be a function of the unknown fault distance.

$$V_F = A_{d_A}^1 V_A^1 + B_{d_A}^1 I_A^1 \tag{9}$$

Where,
$A_{dA}^1 = \cos h(\gamma_{AJ}^1 d_A)$
$B_{dA}^1 = -Z_{CAJ}^1 \sin h(\gamma_{AJ}^1 d_A)$
$d_A$—distance to the fault measured from terminal A $A_{dA}^1$, $B_{dA}^1$—positive sequence ABCD parameters defined for the line up to fault point
$Z_{CAJ}^1$—characteristic impedance of section AJ
$\gamma_{AJ}^1$—propagation constant of section AJ
VF—Voltage at F calculated from terminal A From two-port networks between F and J; and J and B, and using the voltage VF calculated in equation (9), the current $I_{fA}$ can be calculated as in (10). This will be a function of the unknown fault distance.

$$I_{fA} = \frac{V_F - A_{L_A-d_A}^1 (A_{BJ}^1 V_B^1 + B_{BJ}^1 I_B^1)}{B_{L_A-d_A}^1} \tag{10}$$

Substituting (9) in (10), we get, $$I_{fA} = \frac{A_{d_A}^1 V_A^1 + B_{d_A}^1 I_A^1 - A_{L_A-d_A}^1 (A_{BJ}^1 V_B^1 + B_{BJ}^1 I_B^1)}{B_{L_A-d_A}^1} \tag{11}$$

Where,
$A_{L_A-d_A}^1 = \cos h(\gamma_{AJ}(L_A-d_A));\; B_{L_A-d_A}^1 = -Z_{CAJ}^1 \sin h(\gamma_{AJ}(L_A-d_A))$ $d_A$—distance to the fault measured from terminal A
$A_{L_A-d_A}^1 B_{L_A-d_A}^1$—positive sequence ABCD parameters defined for the line upto fault point
$Z_{CAJ}^1$—characteristic impedance of section AJ
$\gamma_{AJ}^1$—propagation constant of section AJ The sum of all the three currents at the junction is equated to zero to obtain the fault location at 410. Accordingly, equate the sum of all three currents, $I_{fA}$, $I_{fB}$ and $I_{fC}$ to zero, since the sum of currents at any node is equal to zero. Using this relation, solve for the unknown fault location.

$$I_{fA} + I_{fB} + I_{fC} \tag{12}$$

Substituting (7), (8) and (11) in (12), we get, $$A_{d_A}^1 V_A^1 + B_{d_A}^1 I_A^1 - \frac{A_{L_A-d_A}^1 \begin{pmatrix} A_{BJ}^1 V_B^1 + \\ B_{BJ}^1 I_B^1 \end{pmatrix}}{B_{L_A-d_A}^1} + C_{BJ}^1 V_B^1 + D_{BJ}^1 I_B^1 + C_{CJ}^1 V_C^1 + D_{CJ}^1 I_C^1 = 0 \tag{13}$$

Simplifying equation (13) further gives, $$A_{d_A}^1 V_A^1 + B_{d_A}^1 I_A^1 - A_{L_A-d_A}^1 (A_{BJ}^1 V_B^1 + B_{BJ}^1 I_B^1) + B_{L_A-d_A}^1 (C_{BJ}^1 V_B^1 + D_{BJ}^1 I_B^1 + C_{CJ}^1 V_C^1 + D_{CJ}^1 I_C^1) = 0 \tag{14}$$

Substituting for $A_{L_A-d_A}^1$, $B_{L_A-d_A}^1$, $A_{d_A}^1$, $B_{d_A}^1$ in equation (14), gives equation (15) as below, $$V_A^1 \cosh(\gamma_{AJ} d_A) - Z_{CAJ}^1 \sinh(\gamma_{AJ} d_A) * I_A^1 = \\ \cosh(\gamma_{AJ}(L_A - d_A)) * (A_{BJ}^1 V_B^1 + B_{BJ}^1 I_B^1) + \\ Z_{CAJ}^1 \sinh(\gamma_{AJ}(L_A - d_A))(C_{BJ}^1 V_B^1 + D_{BJ}^1 I_B^1 + C_{CJ}^1 V_C^1 + D_{CJ}^1 I_C^1) \tag{15}$$

The cosine and sine hyperbolic terms can be expanded such as, $$\sin h(\gamma_{AJ}(L_A-d_A)) = \sin h(\gamma_{AJ} L_A)\cos h(\gamma_{AJ} L_A d_A) - \cos h(\gamma_{AJ} L_A)\sin h(\gamma_{AJ} L_A d_A)$$

Expanding, the cosine and sine hyperbolic terms in equation (15) and simplifying, we get equation (16), $$(C_{AJ}^1 V_A^1 - I_A^1 A_{AJ}^1 + C_{BJ}^1 V_B^1 + D_{BJ}^1 I_B^1 + C_{CJ}^1 V_C^1 + D_{CJ}^1 I_C^1) * \sinh(\gamma_{AJ}^1 d_A) = \cosh(\gamma_{AJ}^1 d_A) * (V_A^1 A_{AJ}^1 + I_A^1 B_{AJ}^1 - V_B^1 A_{BJ}^1 - I_B^1 B_{BJ}^1) \quad (16)$$

Simplifying further, $$\frac{\sinh(\gamma_{AJ}^1 d_A)}{\cosh(\gamma_{AJ}^1 d_A)} = \frac{\begin{pmatrix} V_A^1 - V_B^1 A_{AJ}^1 A_{BJ}^1 - \\ I_B^1 A_{AJ}^1 B_{BJ}^1 + B_{AJ}^1 C_{BJ}^1 V_B^1 + \\ B_{AJ}^1 D_{BJ}^1 I_B^1 + B_{AJ}^1 C_{CJ}^1 V_C^1 + \\ B_{AJ}^1 D_{CJ}^1 I_C^1 \end{pmatrix}}{Zc_{AJ}^1 * \begin{pmatrix} I_A^1 - C_{AJ}^1 A_{BJ}^1 V_B^1 - \\ C_{AJ}^1 B_{BJ}^1 I_B^1 + A_{AJ}^1 C_{BJ}^1 V_B^1 + \\ A_{AJ}^1 D_{BJ}^1 I_B^1 + A_{AJ}^1 C_{CJ}^1 V_C^1 + \\ A_{AJ}^1 D_{CJ}^1 I_C^1 \end{pmatrix}}$$

The unknown fault location $d_A$ can be derived from the above equation as, $$d_A = \frac{1}{\gamma_{AJ}^1} \tanh^{-1}\left(\frac{K1}{K2}\right) \quad (17)$$

Where, $$K1 = (V_A^1 - V_B^1 A_{AJ}^1 A_{BJ}^1 - I_B^1 A_{AJ}^1 B_{BJ}^1 + B_{AJ}^1 C_{BJ}^1 V_B^1 + B_{AJ}^1 D_{BJ}^1 I_B^1 + B_{AJ}^1 C_{CJ}^1 V_C^1 + B_{AJ}^1 D_{CJ}^1 I_C^1)$$

$$K2 = (Zc_{AJ}^1 * (I_A^1 - C_{AJ}^1 A_{BJ}^1 V_B^1 - C_{AJ}^1 B_{BJ}^1 I_B^1 - A_{AJ}^1 C_{BJ}^1 V_B^1 - A_{AJ}^1 D_{BJ}^1 I_B^1 - A_{AJ}^1 C_{CJ}^1 V_C^1 - A_{AJ}^1 D_{CJ}^1 I_C^1)$$

The fault locator can obtain the fault location by calculating the inverse hyperbolic tangent. This may be calculated by making certain assumptions or taking only a limited number of terms in the expansion series for the hyperbolic.

Case III: Fault in Section BJ

For fault in section BJ, the unknown fault location from terminal B is denoted by $d_B$. Like in case of section AJ, calculate currents at the junctions on all three sections. Equate the sum of all three currents to zero and solve for unknown fault distance as in equation (18)

$$d_B = \frac{1}{\gamma_{BJ}^1} \tanh^{-1}\left(\frac{K1}{K2}\right) \quad (18)$$

Where, $$K1 = (V_B^1 - V_A^1 A_{AJ}^1 A_{BJ}^1 - I_A^1 A_{BJ}^1 B_{AJ}^1 + B_{BJ}^1 C_{AJ}^1 V_A^1 + B_{BJ}^1 D_{AJ}^1 I_A^1 + B_{BJ}^1 C_{CJ}^1 V_C^1 + B_{BJ}^1 D_{CJ}^1 I_C^1)$$

$$K2 = (Zc_{BJ}^1 * (I_B^1 - C_{BJ}^1 A_{AJ}^1 V_A^1 - C_{BJ}^1 B_{AJ}^1 I_A^1 - A_{BJ}^1 C_{AJ}^1 V_A^1 - A_{BJ}^1 D_{AJ}^1 I_A^1 - A_{BJ}^1 C_{CJ}^1 V_C^1 - A_{BJ}^1 D_{CJ}^1 I_C^1)$$

Case IV: Fault in Section CJ

For fault in section CJ, the unknown fault location from terminal C is denoted by dC. Like the above, equate the sum of all three currents at the junction to zero and solve for unknown fault distance as in equation (19)

$$d_{C1} = \frac{1}{\gamma_{CJ}^1} \tanh^{-1}\left(\frac{K1}{K2}\right) \quad (19)$$

Where, $$K1 = (V_C^1 - V_A^1 A_{AJ}^1 A_{CJ}^1 - I_A^1 A_{CJ}^1 B_{AJ}^1 + B_{CJ}^1 C_{AJ}^1 V_A^1 + B_{CJ}^1 D_{AJ}^1 I_A^1 + B_{CJ}^1 C_{BJ}^1 V_B^1 + B_{CJ}^1 D_{BJ}^1 I_B^1)$$

$$K2 = (Zc_{CJ}^1 * (I_C^1 - C_{CJ}^1 A_{AJ}^1 V_A^1 - C_{CJ}^1 B_{AJ}^1 I_A^1 - A_{CJ}^1 C_{BJ}^1 V_B^1 - A_{CJ}^1 D_{BJ}^1 I_B^1 - A_{CJ}^1 C_{AJ}^1 V_A^1 - A_{CJ}^1 D_{AJ}^1 I_A^1)$$

The invention provides an accurate fault location device and method for multi-terminal/tapped lines using synchronized data from all terminals. The solution identifies the faulted section first, and then points the fault location on the identified section. This invention requires post fault positive sequence voltage and current measurements and positive sequence line parameters only. This invention is independent of source impedances, fault resistance, loading information, phase unbalance, zero sequence parameters, mutual compensation, fault loop information etc.

We claim:

1. A device for use in a power transmission system comprising a multiterminal tapped line, wherein the power transmission system comprises a first section, a second section and a third section that are connected at a junction, the first section being from a first terminal to the junction, the second section being from a second terminal to the junction, and the third section being from a third terminal to the junction, wherein the device is configured to determine a fault located in the first section, the second section or the third section, the device comprising:
   an input interface for receiving one or more of:
      measurements of voltages and currents carried out at one or more of the first terminal, the second terminal and the third terminal; and
      positive sequence voltage and current phasors obtained from the measurements of voltages and currents carried out at one or more of the first terminal, the second terminal and the third terminal;
   a phasor calculation module for calculating positive sequence voltage and current phasors from the measurements of voltages and currents carried out at a terminal of the power transmission system;
   a storage with positive sequence line impedance parameters of each section of the power transmission system; and
   a fault locator for obtaining the fault location based on the section with the fault, the positive sequence voltage and current phasors obtained for each terminal, and the positive sequence line impedance parameters of each section.

2. The device of claim 1, wherein the fault locator is configured to obtain the fault location by calculating an inverse hyperbolic tangent of K1/K2, wherein K1 and K2 are calculated from one or more of the positive sequence voltage and current phasors of each terminal and from the positive sequence line impedance parameters of each section.

3. The device of claim 2, wherein the positive sequence line impedance parameters comprises parameters associated with charging currents.

4. The device of claim 1, wherein K1 and K2 are obtained by equating the current flowing at the junction end in the first, second and third sections;
   wherein, for the two sections that are the sections other than the section with the fault, the current flowing into the junction is calculated with at least the positive sequence voltage and current phasors obtained from measurements carried out at the corresponding terminals and the positive sequence line impedance parameters of the corresponding sections; and wherein in the section with the fault, the current at the junction end is calculated as a function of the unknown fault location with at least the positive sequence voltage and current phasors obtained from measurements carried out at the corresponding terminal and the positive sequence line impedance parameters of the corresponding section.

5. The device of claim 4, wherein the current at the junction end of the section with the fault is calculated by:

calculating the voltage at the fault location from a two port network between the corresponding terminal and the fault location; and calculating the current at the junction end from a two port network between the fault location and the junction, using the voltage at the fault location.

6. The device of claim 1, wherein the device is an Intelligent Electronic Device associated with one of the first terminal, the second terminal, and the third terminal, wherein the Intelligent Electronic Device is configured to:

obtain measurements of voltages and currents carried out at the corresponding terminal;

obtain positive sequence voltage and current phasors from the measurements of voltages and currents carried out at the corresponding terminal; and receive positive sequence voltage and current phasors obtained from the voltage and current measurements carried out at the other terminals, from Intelligent Electronic Devices associated with the corresponding terminals.

7. The device of claim 1, further comprising a fault section identification module for determining the section having the fault, from the positive sequence voltage and current phasors obtained from the measurements of voltages and currents carried out at each terminal of the power transmission system after the fault has occurred in the power transmission system, wherein the section with the fault is determined by:

calculating a voltage phasor for each terminal of the power transmission system, wherein the calculation of the voltage phasor for a terminal is performed using the current phasor of the corresponding terminal and at least the voltage and current phasors obtained for at least one other terminal of the power transmission system; and determining the section having the fault, based on a comparison of the calculated and obtained voltage phasors for each terminal.

8. The device of claim 7, wherein the section with the fault is determined by comparing the difference between the calculated and obtained voltage phasors for each terminal.

9. A device for use in a power transmission system comprising a multiterminal tapped line, wherein the power transmission system comprises a first section, a second section and a third section that are connected at a junction, the first section being from a first terminal to the junction, the second section being from a second terminal to the junction, and the third section being from a third terminal to the junction, wherein the device is configured to determine a fault located in the first section, the second section or the third section, the device comprising:

an input interface configured to receive measurements of voltages and currents carried out at one or more of the first terminal, the second terminal and the third terminal, or positive sequence voltage and current phasors obtained from the measurements of voltages and currents carried out at one or more of the first terminal, the second terminal and the third terminal;

a storage with positive sequence line impedance parameters of each section of the power transmission system;

a processing unit coupled to the input interface, the processing unit comprising one or more processors;

a non-transitory storage medium storing a program that, when executed by the processing unit causes the processing unit to:

calculate positive sequence voltage and current phasors from the measurements of voltages and currents carried out at a terminal of the power transmission system; and obtain the fault location based on the section with the fault, the positive sequence voltage and current phasors obtained for each terminal, and the positive sequence line impedance parameters of each section, wherein the fault location is obtained by calculating an inverse hyperbolic tangent of K1/K2, wherein K1 and K2 are calculated from one or more of the positive sequence voltage and current phasors of each terminal and from the positive sequence line impedance parameters of each section.

10. The device of claim 9, wherein K1 and K2 are obtained by equating the current flowing at the junction end in the first, second and third sections;

wherein, for the two sections that are the sections other than the section with the fault, the current flowing into the junction is calculated with at least the positive sequence voltage and current phasors obtained from measurements carried out at the corresponding terminals and the positive sequence line impedance parameters of the corresponding sections;

wherein in the section with the fault, the current at the junction end is calculated as a function of the unknown fault location with at least the positive sequence voltage and current phasors obtained from measurements carried out at the corresponding terminal and the positive sequence line impedance parameters of the corresponding section; and wherein the current at the junction end of the section with the fault is calculated by calculating the voltage at the fault location from a two port network between the corresponding terminal and the fault location and calculating the current at the junction end from a two port network between the fault location and the junction, using the voltage at the fault location.

11. The device of claim 9, wherein the device is an Intelligent Electronic Device associated with one of the first terminal, the second terminal, and the third terminal, wherein the Intelligent Electronic Device is configured to:

obtain measurements of voltages and currents carried out at the corresponding terminal;

obtain positive sequence voltage and current phasors from the measurements of voltages and currents carried out at the corresponding terminal; and receive positive sequence voltage and current phasors obtained from the voltage and current measurements carried out at the other terminals, from Intelligent Electronic Devices associated with the corresponding terminals.

12. The device of claim 9, further comprising a fault section identification module for determining the section having the fault, from the positive sequence voltage and current phasors obtained from the measurements of voltages and currents carried out at each terminal of the power transmission system after the fault has occurred in the power transmission system, wherein the section with the fault is determined by:
  calculating a voltage phasor for each terminal of the power transmission system, wherein the calculation of the voltage phasor for a terminal is performed using the current phasor of the corresponding terminal and at least the voltage and current phasors obtained for at least one other terminal of the power transmission system; and
  determining the section having the fault, based on a comparison of the calculated and obtained voltage phasors for each terminal.

13. The device of claim 12, wherein the section with the fault is determined by comparing the difference between the calculated and obtained voltage phasors for each terminal.

14. A method for determining a fault in a power transmission system comprising a multiterminal tapped line, wherein the power transmission system comprises a first section, a second section and a third section that are connected at a junction, the first section being from a first terminal to the junction, the second section being from a second terminal to the junction, and the third section being from a third terminal to the junction, the method comprising:
  receiving measurements of voltages and currents carried out at one or more of the first terminal, the second terminal and the third terminal or positive sequence voltage and current phasors obtained from the measurements of voltages and currents carried out at one or more of the first terminal, the second terminal and the third terminal;
  calculating positive sequence voltage and current phasors from the measurements of voltages and currents carried out at a terminal of the power transmission system;
  storing positive sequence line impedance parameters of each section of the power transmission system; and
  obtaining a fault location in the first section, the second section or the third section based on the positive sequence voltage and current phasors obtained for each terminal and the positive sequence line impedance parameters of each section.

15. The method of claim 14, wherein obtaining the fault location comprises calculating an inverse hyperbolic tangent of K1/K2, wherein K1 and K2 are calculated from one or more of the positive sequence voltage and current phasors of each terminal and from the positive sequence line impedance parameters of each section.

16. The method of claim 15, wherein the positive sequence line impedance parameters comprises parameters associated with charging currents.

17. The method of claim 14, wherein K1 and K2 are obtained by equating the current flowing at the junction end in the first, second and third sections;
  wherein, for the two sections that are the sections other than the section with the fault, the current flowing into the junction is calculated with at least the positive sequence voltage and current phasors obtained from measurements carried out at the corresponding terminals and the positive sequence line impedance parameters of the corresponding sections; and
  wherein in the section with the fault, the current at the junction end is calculated as a function of the unknown fault location with at least the positive sequence voltage and current phasors obtained from measurements carried out at the corresponding terminal and the positive sequence line impedance parameters of the corresponding section.

18. The method of claim 17, wherein the current at the junction end of the section with the fault is calculated by:
  calculating the voltage at the fault location from a two port network between the corresponding terminal and the fault location; and
  calculating the current at the junction end from a two port network between the fault location and the junction, using the voltage at the fault location.

19. The method of claim 14, wherein method is performed by an Intelligent Electronic Device associated with one of the first terminal, the second terminal, and the third terminal, wherein the Intelligent Electronic Device performs the steps of:
  obtaining measurements of voltages and currents carried out at the corresponding terminal;
  obtaining positive sequence voltage and current phasors from the measurements of voltages and currents carried out at the corresponding terminal; and
  receiving positive sequence voltage and current phasors obtained from the voltage and current measurements carried out at the other terminals, from Intelligent Electronic Devices associated with the corresponding terminals.

20. The method of claim 14, further comprising determining the section having the fault, from the positive sequence voltage and current phasors obtained from the measurements of voltages and currents carried out at each terminal of the power transmission system after the fault has occurred in the power transmission system, wherein the section with the fault is determined by:
  calculating a voltage phasor for each terminal of the power transmission system, wherein the calculation of the voltage phasor for a terminal is performed using the current phasor of the corresponding terminal and at least the voltage and current phasors obtained for at least one other terminal of the power transmission system; and
  determining the section having the fault, based on a comparison of the calculated and obtained voltage phasors for each terminal.

21. The method of claim 20, wherein the section with the fault is determined by comparing the difference between the calculated and obtained voltage phasors for each terminal.

* * * * *